United States Patent
Choi

(10) Patent No.: US 11,372,294 B2
(45) Date of Patent: Jun. 28, 2022

(54) DISPLAY DEVICE

(71) Applicant: ELECTRONICS AND TELECOMMUNICATIONS RESEARCH INSTITUTE, Daejeon (KR)

(72) Inventor: Ji Hun Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/015,173

(22) Filed: Sep. 9, 2020

(65) Prior Publication Data

US 2020/0401007 A1    Dec. 24, 2020

Related U.S. Application Data

(62) Division of application No. 16/026,970, filed on Jul. 3, 2018, now Pat. No. 10,802,367.

(30) Foreign Application Priority Data

Jul. 5, 2017   (KR) .................. 10-2017-0085596
May 31, 2018   (KR) .................. 10-2018-0062993

(51) Int. Cl.
| | | |
|---|---|---|
| *G02F 1/1362* | (2006.01) | |
| *G02F 1/1343* | (2006.01) | |
| *G02F 1/1368* | (2006.01) | |
| *G02F 1/1335* | (2006.01) | |
| *H01L 27/12* | (2006.01) | |
| *G09G 3/36* | (2006.01) | |
| *G02F 1/1333* | (2006.01) | |

(52) U.S. Cl.
CPC ...... *G02F 1/136286* (2013.01); *G02F 1/1368* (2013.01); *G02F 1/13439* (2013.01); *G02F 1/133553* (2013.01); *G02F 1/134336* (2013.01); *G02F 1/136209* (2013.01); *H01L 27/124* (2013.01); *H01L 27/1218* (2013.01); *G02F 1/133357* (2021.01); *G02F 2201/121* (2013.01); *G02F 2201/40* (2013.01); *G09G 3/3681* (2013.01); *G09G 3/3688* (2013.01)

(58) Field of Classification Search
CPC ................................................ G02F 1/136286
See application file for complete search history.

(56) References Cited

U.S. PATENT DOCUMENTS

| | | | |
|---|---|---|---|
| 7,038,229 | B2 | 5/2006 | Jung et al. |
| 8,390,538 | B2 | 3/2013 | Song et al. |
| 2005/0099765 | A1 | 5/2005 | Wang |

(Continued)

FOREIGN PATENT DOCUMENTS

| | | |
|---|---|---|
| KR | 10-2017-0079541 A | 7/2017 |
| KR | 10-2018-0119063 A | 11/2018 |

*Primary Examiner* — Sang V Nguyen
(74) *Attorney, Agent, or Firm* — Rabin & Berdo, P.C.

(57) ABSTRACT

Provided is a display device. The display device includes a data line extending in a first direction, a reflective electrode on the data line, and a transistor formed between the data line and the reflective electrode. The transistor includes a first electrode connected to the data line, a second electrode spaced apart from the first electrode in the first direction and connected to the reflective electrode, and a semiconductor layer connecting the first electrode and the second electrode.

5 Claims, 13 Drawing Sheets

(56) References Cited

U.S. PATENT DOCUMENTS

| | | | |
|---|---|---|---|
| 2005/0140871 A1* | 6/2005 | Hwang | G02F 1/1368 |
| | | | 349/114 |
| 2005/0140874 A1* | 6/2005 | Lim | G02F 1/133555 |
| | | | 349/114 |
| 2007/0159563 A1 | 7/2007 | Moriwaki | |
| 2007/0236414 A1* | 10/2007 | Lin | G02F 1/134309 |
| | | | 345/60 |
| 2009/0268148 A1* | 10/2009 | Ashizawa | G02F 1/133512 |
| | | | 349/155 |
| 2012/0320320 A1 | 12/2012 | Chen et al. | |
| 2013/0057801 A1* | 3/2013 | Park | G02F 1/136209 |
| | | | 349/58 |
| 2014/0084286 A1 | 3/2014 | Jeon et al. | |
| 2016/0071884 A1 | 3/2016 | Miyamoto et al. | |
| 2016/0357049 A1 | 12/2016 | Chen et al. | |
| 2017/0176795 A1 | 6/2017 | Ro et al. | |
| 2017/0317159 A1* | 11/2017 | Kim | H01L 27/3246 |
| 2018/0004037 A1 | 1/2018 | Park et al. | |
| 2018/0090555 A1* | 3/2018 | Lhee | G09G 3/3233 |
| 2018/0157138 A1* | 6/2018 | Wu | H01L 29/786 |
| 2018/0190671 A1* | 7/2018 | Long | H01L 29/78678 |
| 2018/0204856 A1* | 7/2018 | Noh | H01L 29/78696 |

\* cited by examiner

DISPLAY DEVICE

CROSS-REFERENCE TO RELATED APPLICATIONS

The present application is a divisional application of U.S. application Ser. No. 16/026,970, filed on Jul. 3, 2018, which claims priority under 35 U.S.C. § 119 of Korean Patent Application Nos. 10-2017-0085596, filed on Jul. 5, 2017, and 10-2018-0062993, filed on May 31, 2018, the entire contents of which are hereby incorporated by reference.

BACKGROUND

The present disclosure relates to a display device, and more particularly to a display device in which the pitch of pixels is reduced.

As display devices are applied to various fields, there is a growing demand for the quality improvement of the display devices. Recently, a hologram display device using a high resolution panel has been developed, but its technology maturity is weak compared to a conventional display device. In order to develop a high-quality hologram display device, development of a display panel having a high resolution and a wide viewing angle should be prioritized. The resolution and viewing angle of the display panel are related to the pitch of the pixels. The well-known commercial hologram panel of Jasper Display has a minimum pixel pitch of 3.74 µm. When the pitch of the pixels is reduced to 3 µm or less, the viewing angle increases sharply. Recently, research has been actively conducted to reduce the pitch of pixels of a display device.

SUMMARY

The present disclosure provides a display device having improved resolution and a wide viewing angle.

An embodiment of the inventive concept provides a display device includes: a data line extending in a first direction; a reflective electrode on the data line; and a transistor formed between the data line and the reflective electrode, wherein the transistor includes: a first electrode connected to the data line; a second electrode spaced apart from the first electrode in the first direction and connected to the reflective electrode; and a semiconductor layer connecting the first electrode and the second electrode.

In an embodiment, the semiconductor layer may be vertically overlapped with the data line and the reflective electrode.

In an embodiment, the display device may further include a gate line extending in a second direction intersecting the first direction, wherein a portion of the gate line may be located between the semiconductor layer and the data line.

In an embodiment, the display device may further include a gate line extending in a second direction intersecting the first direction, wherein the reflective electrode may extend in the first direction, and the reflective electrode may intersect the gate line, the reflective electrode being insulated from the gate line.

In an embodiment, the display device may further include a planarization film covering the transistor and have a flat upper surface, wherein the reflective electrode may be located on the planarization film.

In an embodiment, a width of the reflective electrode may be equal to a width of the data line.

In an embodiment, the display device may further include: a common electrode on the reflective electrode; and a liquid crystal layer between the reflective electrode and the common electrode.

In an embodiment, the display device may further include a gate line extending in a second direction intersecting the first direction, wherein a width of the first direction of the gate line may be greater than a width of the second direction of the data line.

In an embodiment, the display device may further include: a gate line extending in a second direction intersecting the first direction; and a shielding pattern between the gate line and the data line.

In an embodiment, the display device may further include a contact plug disposed between the first electrode and the data line, wherein the contact plug may connect the first electrode and the data line electrically.

In an embodiment, the data line may have a zigzag shape.

In an embodiment, the data line may include: a first portion extending in the first direction and at least partially overlapping the first electrode; a second portion extending in the first direction and spaced apart from the first portion in the first direction and a second direction, the second direction being perpendicular to the first direction; and a connection portion connecting the first portion and the second portion.

In an embodiment, the second portion may be spaced apart from the second electrode in the second direction.

In an embodiment, the second portion may be spaced apart from the semiconductor layer in the second direction.

In an embodiment, the display device may further include a gate line extending in a second direction intersecting the first direction, wherein the gate line may be spaced apart from the first portion in the first direction.

In an embodiment of the inventive concept, a display device includes: data lines extending in a first direction and arranged in a second direction intersecting the first direction; gate lines extending in the second direction and intersecting the data lines, the gate lines being insulated from the data lines; and reflective electrodes disposed on intersection points of the data lines and the gate lines, respectively, wherein a width of the first direction of the reflective electrodes is greater than a width of the second direction of the reflective electrodes, and an interval between the data lines is less than or equal to a width of the second direction of each of the data lines.

In an embodiment, the reflective electrode may be completely overlapped with the data line.

In an embodiment, an interval between the data lines may be less than an interval between the gate lines.

In an embodiment, a width of the first direction of each of the gate lines may be greater than a width of the second direction of each of the data lines.

In an embodiment, at least one data line of the data lines may include: a first portion extending in the first direction and at least partially overlapping the reflective electrode; and a second portion extending in the first direction and spaced apart from the first portion in the first direction and in the second direction, wherein the second portion may be located between the reflective electrodes.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
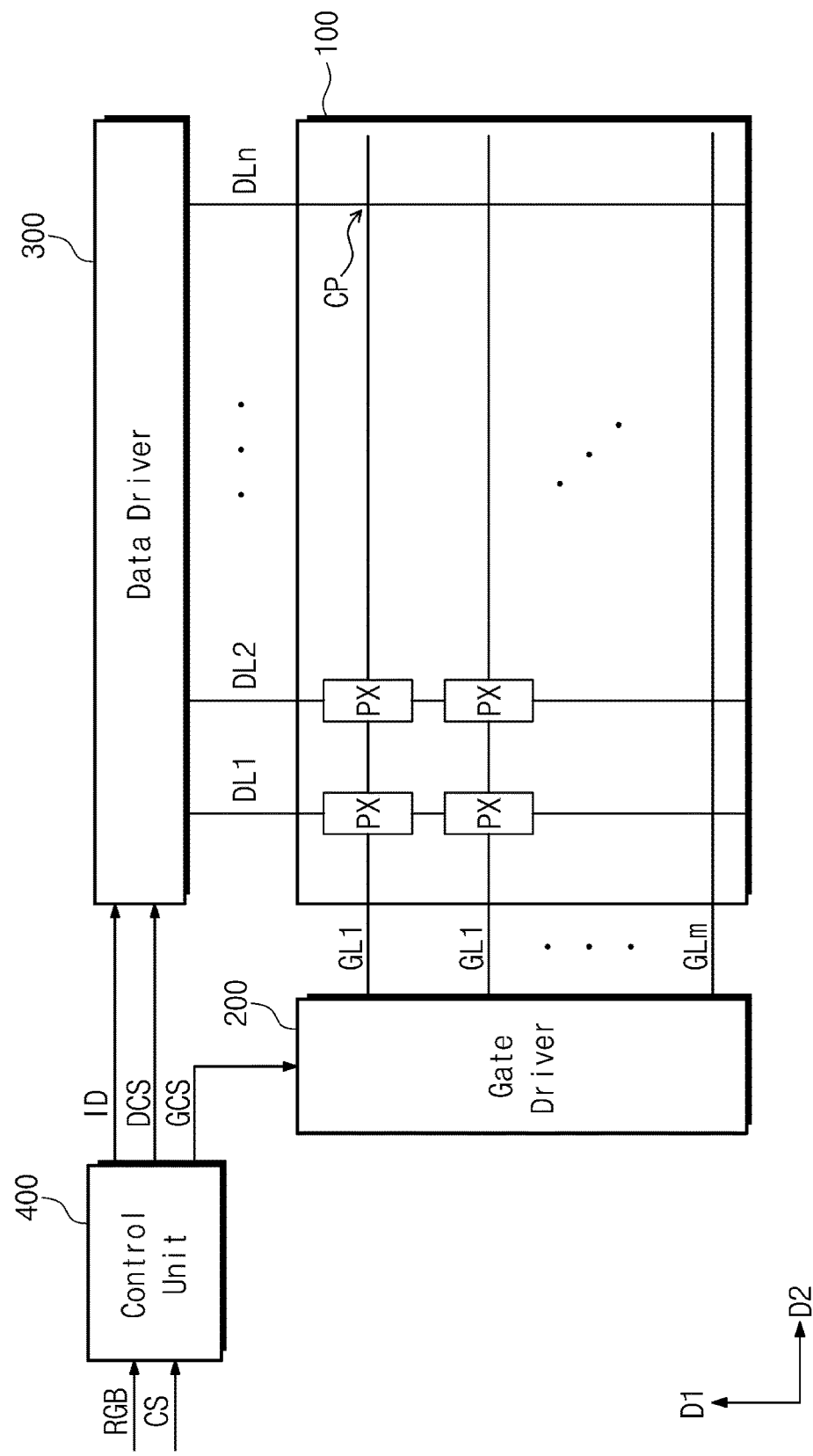
FIG. 1 is a schematic block diagram of a display device according to embodiments of the inventive concept.

Advantages and features of the inventive concept, and implementation methods thereof will be clarified through following embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Further, the inventive concept is only defined by scopes of claims. Like reference numbers refer to like elements throughout the entire specification.

The terms used in this specification are used only for explaining specific embodiments while not limiting the inventive concept. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, embodiments described in this specification will be described with plan views sectional views, that is, ideal exemplary views of the inventive concept. In the drawings, the thicknesses of a layer and an area are exaggerated for effective description. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, this should not be construed as limited to the scope of the inventive concept.

Hereinafter, embodiments of the inventive concept will be described in detail with reference to the drawings.

FIG. 1 is a schematic block diagram of a display device according to embodiments of the inventive concept.

Referring to FIG. 1, a display device according to embodiments of the inventive concept may include a control unit 400, a gate driver 200, a data driver 300, and a display panel 100. The control unit 400 may drive the gate driver 200 and the data driver 300. The gate driver 200 and the data driver 300 may drive the display panel 100.

Specifically, the control unit 400 may receive input image data RGB and control signals CS from the outside of the display device. The control unit 400 may convert the received input image data RGB to generate image data ID. For example, converting the received input image data RGB may include converting the data format of the input image data RGB according to the interface specification of the data driver 300. The control unit 400 may provide the image data ID to the data driver 300.

In addition, the control unit 400 may generate the data control signal DCS and the gate control signal CS based on the received control signal CS. The gate control signal CS may include, for example, a vertical start signal, a vertical clock signal, and a vertical clock bar signal. The control unit 400 may provide the data control signal CS to the data driver 300. The control unit 400 may provide the gate control signal CS to the gate driver 200.

The gate driver 200 may sequentially output the gate signals in response to the gate control signal CS provided from the control unit 400.

The data driver 300 converts the image data ID into data voltages and outputs the data voltages in response to the data control signal DCS provided from the control unit 400. The outputted data voltages may be applied to the display panel 100.

The display panel 100 may include gate lines GL1, GL2, and GLm, data lines DL1, DL2, and DLn, and pixels PX. The gate lines GL1, GL2, and GLm may receive gate signals from the gate driver 200. The data lines DL1, DL2, and DLn may receive the data voltage from the data driver 300. The gate lines GL1, GL2, and GLm may be insulated from and intersect with the data lines DL1, DL2, and DLn.

The pixels PX may be connected to a corresponding one of the data lines DL1 to DLm and may be connected to a corresponding one of the gate lines GL1 to GLn. The pixels PX may display the primary color. Each of the pixels PX may display, for example, any one of red, green, and blue. However, the colors that the pixels PX may display are not limited thereto. Each of the pixels PX may display one of red, green, and blue colors. The pixels PX may be arranged in the form of a two-dimensional matrix in the display panel 100. The pixels PX may be an area for displaying a unit image constituting an image. In other words, the resolution of the display panel 100 may be determined according to the number of the pixels PX included in the display panel 100. In FIG. 1, only a part of the pixels PX are shown, and the rest are omitted. The pixels PX may be formed by overlapping the intersection points CP of the gate lines GL1, GL2, and GLm and the data lines DL1, DL2, and DLn. In this specification, an intersection point CP may refer to a portion where the gate lines GL1, GL2, and GLm and the data lines DL1, DL2, and DLn intersect with each other in plan view. A more specific structure of the pixels PX, the gate lines GL1, GL2, and GLm, and the data lines DL1, DL2, and DLn will be described with reference to FIGS. 3. and 4.

Figure 2:
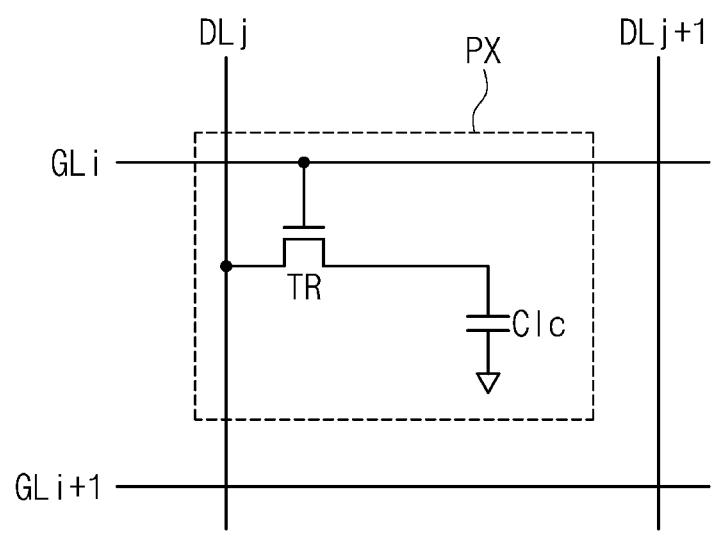
FIG. 2 is an equivalent circuit diagram of a display device according to embodiments of the inventive concept.

FIG. 2 is an equivalent circuit diagram of a display device according to embodiments of the inventive concept.

As shown in FIG. 2, each of the pixels PX may include a transistor TR and a capacitor Clc. The transistor TR may be electrically connected to the i-th gate line GLi and the j-th data line DLj. The transistor TR may output a data signal received from the j-th data line DLj in response to the gate signal received from the i-th gate line GLi. The capacitor Clc may charge the voltage corresponding to the data signal outputted from the j-th data line DLj. An arrangement of liquid crystal directors (not shown) included in a liquid crystal layer 124 (see FIG. 4) may be changed according to a charge amount charged in the capacitor Clc. The light incident to the liquid crystal layer 124 may be transmitted or blocked according to the arrangement of liquid crystal directors.

Figure 3:
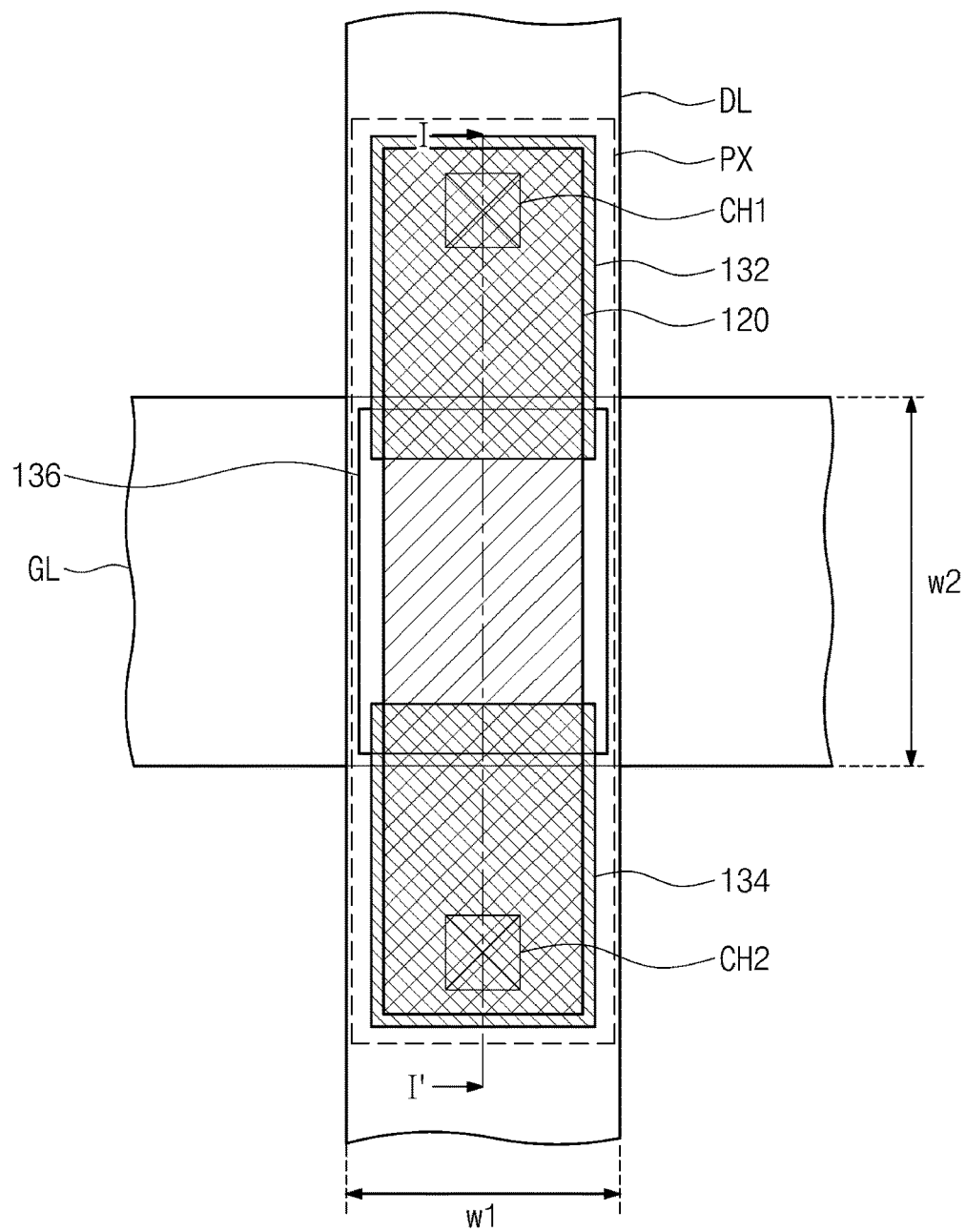
FIG. 3 is a plan view for explaining a display device according to embodiments of the inventive concept.
Figure 4:
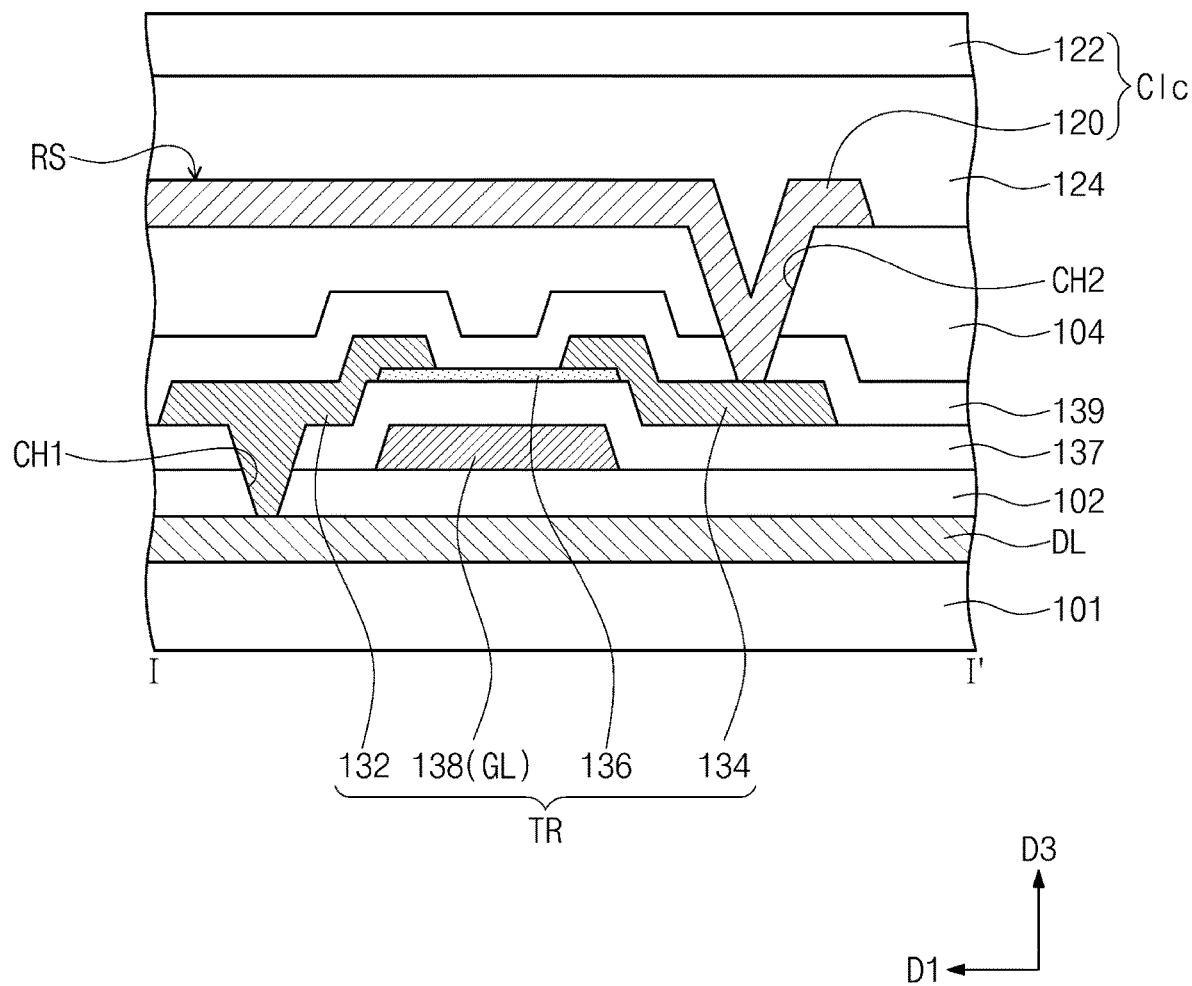
FIG. 4 is a cross-sectional view taken along a line I-I' of FIG. 3.
Figure 5A:
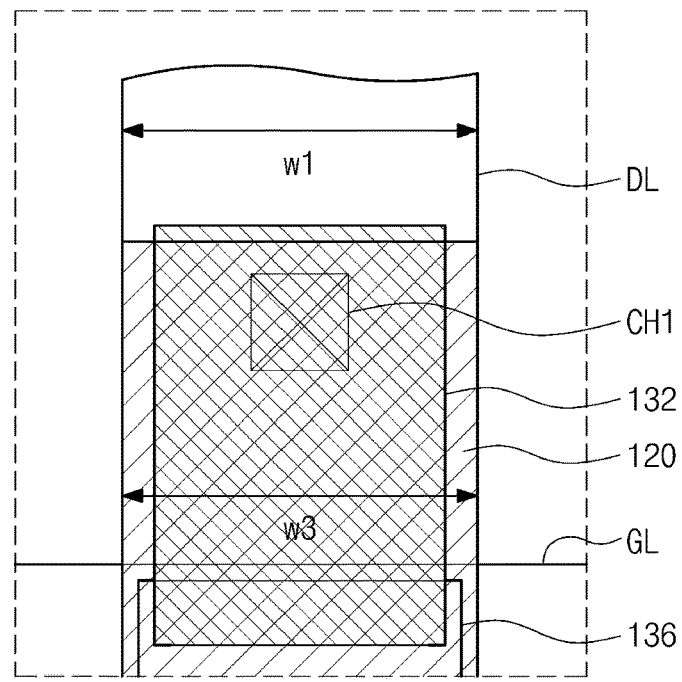
FIGS. 5A and 5B are enlarged plan views showing a portion of a display device according to the embodiments of the inventive concept.
Figure 5B:
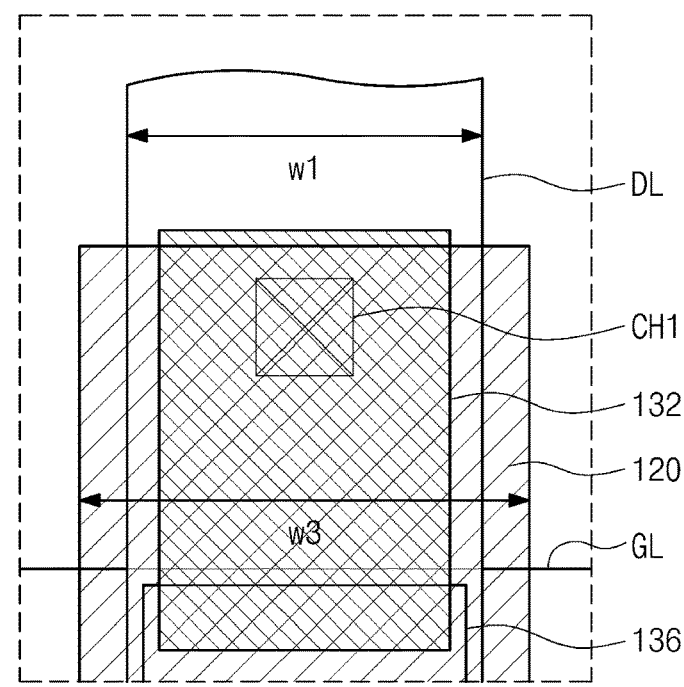

FIG. 3 is a plan view for explaining a display device according to embodiments of the inventive concept. FIG. 4 is a cross-sectional view taken along a line I-I' of FIG. 3. FIGS. 5A and 5B are enlarged plan views illustrating a portion of a display device according to embodiments of the inventive concept.

Referring to FIGS. 3 and 4, a display device according to embodiments of the inventive concept includes a data line DL on a substrate 101, a gate line GL intersecting the data line DL, and a pixel PX overlapping the date line DL.

The data lines DL may be disposed on the substrate 101. The data lines DL may extend in a first direction D1 parallel to the upper surface of the substrate 101. The data line DL may be located under the transistor TR. In other words, the upper surface of the data line DL may be located at a lower level than the lower surface of the source or drain electrode of the transistor TR. The data line DL includes, for example, copper (Cu), molybdenum (Mo), aluminum (Al), titanium (Ti), aluminum-nickel (Al—Ni) alloy, Cu alloy, Mo alloy, and Al alloy. The data line DL may deliver the data signal to the transistor TR. The data line DL may be any one of the data lines DL1 to DLm described with reference to FIG. 1.

The gate line GL may be disposed on the data line DL. The gate line GL may extend in the second direction D2. The second direction D2 may be parallel to the upper surface of the substrate 101 and may be perpendicular to the first direction D1. The gate line GL may be spaced from the data line DL in a third direction D3. The third direction D3 may be a direction perpendicular to the first direction D1 and the second direction D2. The gate line GL may be electrically separated from the data line DL. The gate line GL may include the same material as the data line DL. The gate line GL may deliver the gate signal to the transistor TR. The gate line GL may be any one of the gate lines GL1 to GLn described with reference to FIG. 1. According to the embodiments, the width w2 of the gate line GL may be larger than the width w1 of the data line DL. Therefore, the semiconductor layer 136 to be described later may be formed to have a length in the first direction D1 that is larger than the width w1 of the data line DL.

The buffer layer 102 may be disposed between the data line DL and the gate line GL. The buffer layer 102 may include an insulating material. The buffer layer 102 may cover the substrate 101 and the data lines DL. The buffer layer 102 may be formed entirely on the substrate 101 and the data lines DL. The buffer layer may isolate the data lines DL and the gate lines GL from each other.

The pixel PX may be formed so as to overlap with the data line DL, as shown in FIG. 3. The pixel PX may be an area for displaying an image of the smallest unit constituting the image of the display device. For example, the image of the display device may be displayed on an upper surface RS of a reflective electrode 120. For example, the pixel PX may at least partially overlap with a portion where the gate line GL and the data line DL intersect. The pixel PX may have a shape extending in the first direction D1. In other words, in relation to the pixel PX, the width in the first direction D1 may be larger than the width in the second direction D2. According to the embodiments, the pixel PX may intersect the gate line GL and completely overlap the data line DL. The pixel PX may include a transistor TR and a capacitor Clc.

The transistor TR may be formed between the data line DL and the reflective electrode 120. The transistor TR may include a first electrode 132, a second electrode 134, a semiconductor layer 136, and a gate electrode 138. The transistor TR may be a thin film transistor.

The first electrode 132 and the second electrode 134 may be spaced apart from each other in the first direction D1. The first electrode 132 may be a drain electrode or a source electrode. The second electrode 134 may be different from the first electrode 132 of the drain electrode and the source electrode. The first electrode 132 and the second electrode 134 may include a metal. For example, the first electrode 132 and the second electrode 134 may include the same material as the gate line GL. The first electrode 132 and the second electrode 134 may vertically overlap the data line DL. In addition, the first electrode 132 and the second electrode 134 may vertically overlap the reflective electrode 120.

The first electrode 132 may be connected to the data line DL through a first contact hole CH1. The first contact hole CH1 may be formed between the first electrode 132 and the data line DL. The first contact hole CH1 may expose a portion of the data line DL through a buffer layer 102 and a gate insulating layer 137 to be described later. The first electrode 132 may receive a data signal from the data line DL through the first contact hole CH1. According to the embodiments, the first contact hole CH1 may be completely filled with the first electrode 132. However, the inventive concept is not limited thereto. Unlike the one shown in the drawing, the first electrode 132 may conformally cover the inner side surface of the first contact hole CH1 and the data line DL exposed by the first contact hole CH1.

The second electrode 134 may be connected to the reflective electrode 120 through the second contact hole CH2. A second contact hole CH2 may be formed between the reflective electrode 120 and the second electrode 134. The second contact hole CH2 may be a hole that penetrates a passivation layer 139 and an interlayer insulating layer 104 to be described later and exposes a portion of the upper surface of the second electrode 134. The second contact hole CH2 may be spaced apart from the first contact hole CH1 in the first direction D1. The second electrode 134 may apply a data voltage to the reflective electrode 120 through the second contact hole CH2. Thereby, the reflective electrode 120 may form an electric field with the common electrode 122 to which the common voltage is supplied. According to embodiments, a portion of the reflective electrode 120 may conformally cover the inner side surface of the second contact hole CH2 and the upper surface of the second electrode 134 exposed by the second contact hole CH2. However, the inventive concept is not limited thereto. Unlike the one shown in the drawing, the reflective electrode 120 may completely fill the second contact hole CH2.

A semiconductor layer 136 may be disposed between the first electrode 132 and the second electrode 134. The semiconductor layer 136 may connect the first electrode 132 and the second electrode 134. In other words, the first electrode 132 may be connected to one end of the semiconductor layer 136 and the second electrode 134 may be connected to the other end opposite to the one end of the semiconductor layer 136 in the first direction D1. The semiconductor layer 136 may be formed on the gate insulating layer 137 on the gate line GL and the gate line GL. The semiconductor layer 136 may include amorphous silicon, low temperature polysilicon, or a metal oxide. The semiconductor layer 136 may include a channel area that forms a conductive channel between the first electrode 132 and the second electrode 134 depending on whether a voltage is applied to the gate electrode 138. The semiconductor layer 136 may be disposed on the gate line GL. The semiconductor layer 136 may have a sufficient length in the first direction D1 as the width w2 of the gate line GL is formed to be larger than the width w1 of the data line DL. Thus, the transistor TR may secure a sufficient channel length, and the reliability of the display element may be improved.

The gate electrode 138 may be disposed between the data line DL and the semiconductor layer 136. The gate electrode 138 may be spaced apart from the semiconductor layer 136 in the third direction D3. The gate electrode 138 may be a portion of the gate line GL located between the semiconductor layer 136 and the data line DL. The width of the gate electrode 138 in the first direction D1 may be equal to the width w2 of the gate line GL in the first direction D1. In other words, the gate line GL may have a constant width from the gate electrode 138 and may extend in the second direction D2. The gate line GL may have a constant line width under the transistor TR and the capacitor Clc without curved or protruding portions.

A gate insulating layer 137 may be disposed between the gate electrode 138 and the semiconductor layer 136. The gate insulating layer 137 may include silicon oxide (SiOx) or silicon nitride (SiNx). The gate insulating layer 137 may conformally cover the buffer layer 102 and the gate line GL. According to embodiments, the gate insulating layer 137 may be entirely formed on the buffer layer 102 and the gate line GL.

The passivation layer 139 and the interlayer insulating layer 104 may be provided between the capacitor Clc and the transistor TR. The passivation layer 139 may conformally cover the transistor TR. The passivation layer 139 may function as a protective film for protecting the transistor TR. The interlayer insulating layer 104 may be disposed on the passivation layer 139. The interlayer insulating layer 104 may have a flat upper surface. The interlayer insulating layer 104 may be entirely formed on the substrate 101. The interlayer insulating layer 104 may have a flat upper surface.

A capacitor Clc may be formed on the upper portion of the pixel PX. For example, the capacitor Clc may be formed on the interlayer insulating layer 104. The capacitor Clc may include a reflective electrode 120 and a common electrode 122 arranged to face each other in the third direction D3. The reflective electrode 120 and the common electrode 122 may deflect the liquid crystal director in the liquid crystal layer 124 by applying an electric field to the liquid crystal layer 124 disposed therebetween.

The reflective electrode 120 may be disposed on the flat surface of the interlayer insulating layer 104. The reflective electrode 120 may be opaque and have a large optical thickness. For example, the reflective electrode 120 may include Ag, Mg, Al, Pt, Pd, Au, Ni, Nd, Ir, Cr, Li, Ca, LiF/Ca, LiF/Al, Mo, Ti, or a compound or mixture thereof. According to embodiments, the reflective electrode 120 may be the form of a line extending in the first direction D1. In other words, the width of the reflective electrode 120 in the first direction D1 may be greater than the width of the reflective electrode 120 in the second direction D2. The reflective electrode 120 may have a reflective surface RS for reflecting light provided from the outside of the display device. The reflective surface RS may be formed on the upper surface of the reflective electrode 120. The reflective surface RS may reflect the incident light through the common electrode 122 and the liquid crystal layer 124 from the outside of the display device. According to embodiments, as shown in FIG. 4, the reflective surface RS may have a flat shape. However, unlike this, the reflective surface RS may have a concavo-convex shape to reflect incident light at various angles.

Figure 9:
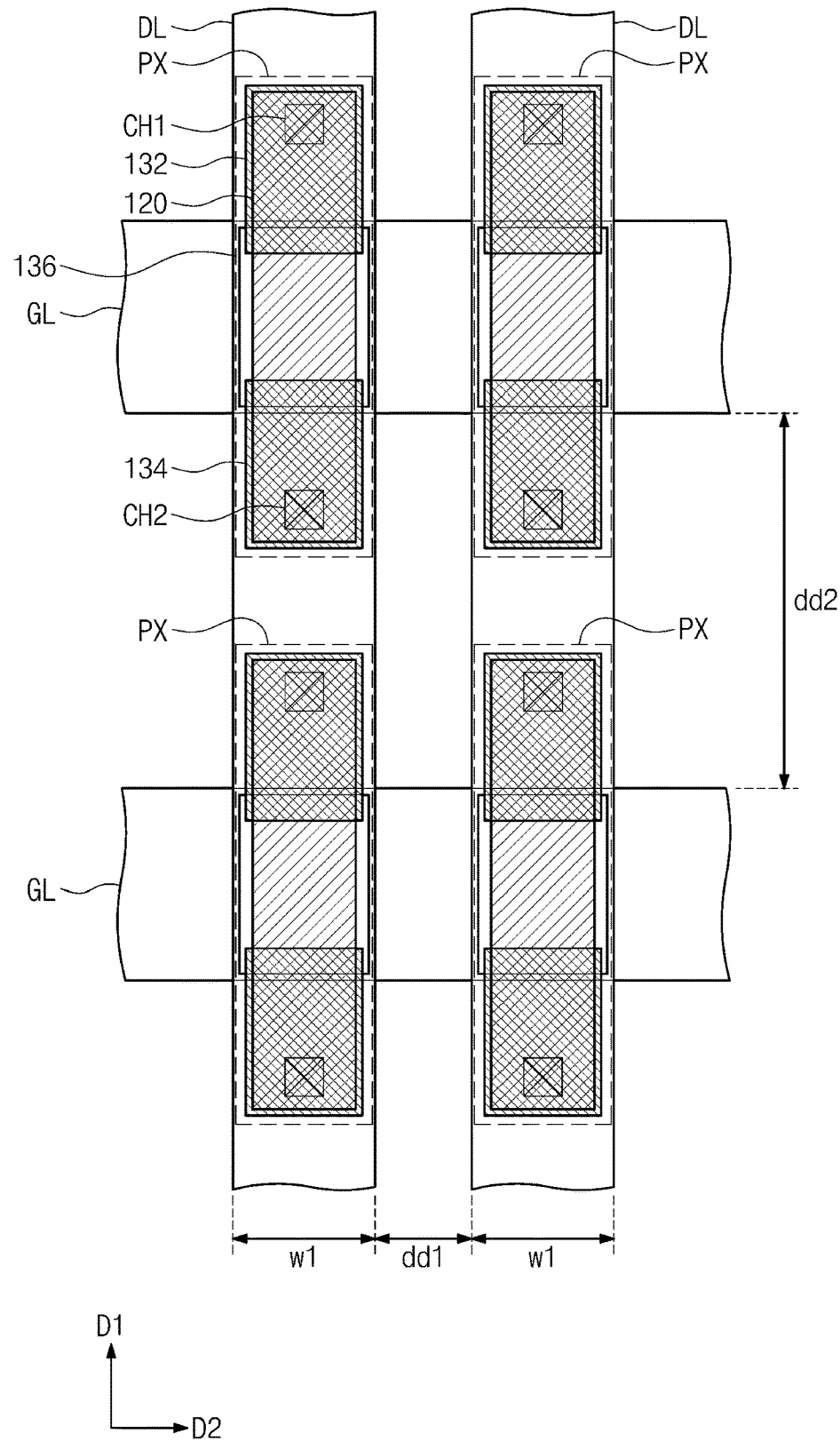
FIG. 9 is a plan view illustrating a display device according to embodiments of the inventive concept.

According to embodiments, as shown in FIG. 4, the reflective electrode 120 may be formed at a higher vertical level than the transistor TR so that light may be incident from the outside. Accordingly, the data line DL extending in the same direction as the reflective electrode 120 is formed at a lower vertical level than the transistor TR so that it may be easily avoided from the contact holes (e.g., the second contact hole CH2). As a result, the data line DL may have a straight line shape, and the interval dd1 between adjacent data lines DL may be reduced, as shown in FIG. 9.

Referring to FIGS. 3, 5A and 5B, the width w3 of the reflective electrode 120 in the second direction D2 is not less than the width w1 of the data line DL in the second direction D2. In one example, as shown in FIG. 5A, the width w3 of the reflective electrode 120 in the second direction D2 may be equal to the width w1 of the data line DL in the second direction D2. In another example, as shown in FIG. 5B, the width w3 of the reflective electrode 120 in the second direction D2 may be greater than the width w1 of the data line DL in the second direction D2. As shown in FIG. 9, since the reflective electrodes 120 should be electrically separated from each other, the width w3 of the second direction D2 of the reflective electrode 120 may be less than the sum of the width w1 of the second direction D2 of the data line DL and the interval dd1 between two adjacent data lines DL.

Referring again to FIGS. 3 and 4, the common electrode 122 may be disposed on the reflective electrode 120. The common electrode 122 may be disposed parallel to the reflective surface RS of the reflective electrode 120. According to one example, the common electrode 122 may be transparent or translucent. The common electrode 122 may have a smaller optical thickness than the reflective electrode 120. The common electrode 122 may include, for example, Li, Ca, LiF/Ca, LiF/Al, Al, Mg, BaF, Ba, Ag, or a compound or mixture thereof. According to embodiments, the common electrode 122 may include a transparent electrode. The common electrode 122 may include, for example, indium tin oxide (ITO), indium zinc oxide (IZO), zinc oxide (ZnO), or indium tin zinc oxide (ITZO).

A liquid crystal layer 124 may be disposed between the reflective electrode 120 and the common electrode 122. The liquid crystal layer 124 may include a plurality of liquid crystal directors having dielectric anisotropy. When an electric field is applied between the reflective electrode 120 and the common electrode 122, the liquid crystal directors of the liquid crystal layer 124 may be aligned in a specific direction to deflect the light passing through the liquid crystal layer 124. Further, the liquid crystal layer 124 may selectively transmit the light deflected in a specific direction. The light incident from the outside of the display device toward the upper surface of the reflective electrode 120 may be absorbed by the liquid crystal layer 124 or reflected by the reflective electrode 120 depending on the electric field applied between the capacitors Clc.

Figure 6:
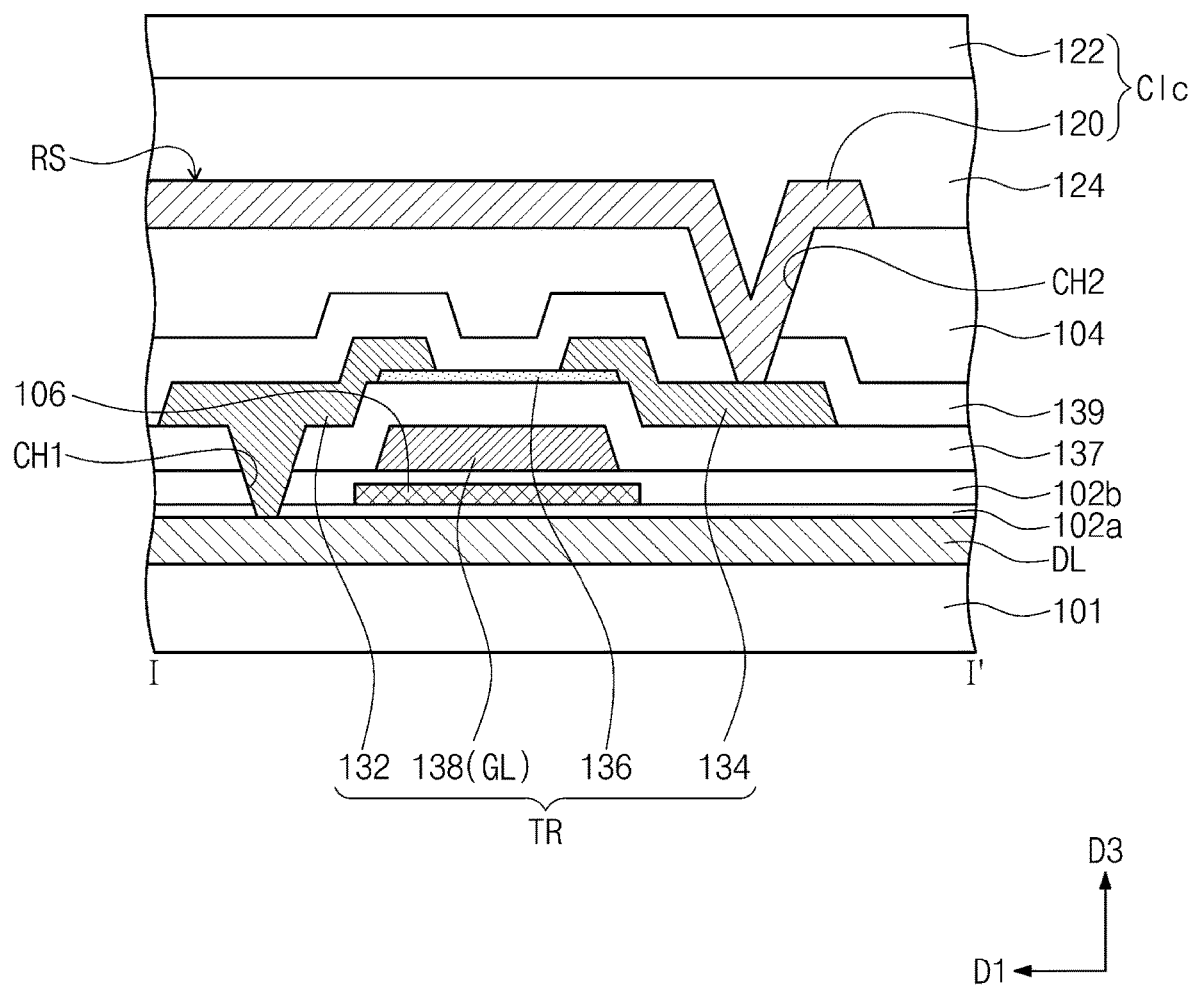
FIGS. 6 and 7 are cross-sectional views of a display device according to embodiments of the inventive concept, and correspond to a portion I-I' of FIG. 3.
Figure 7:
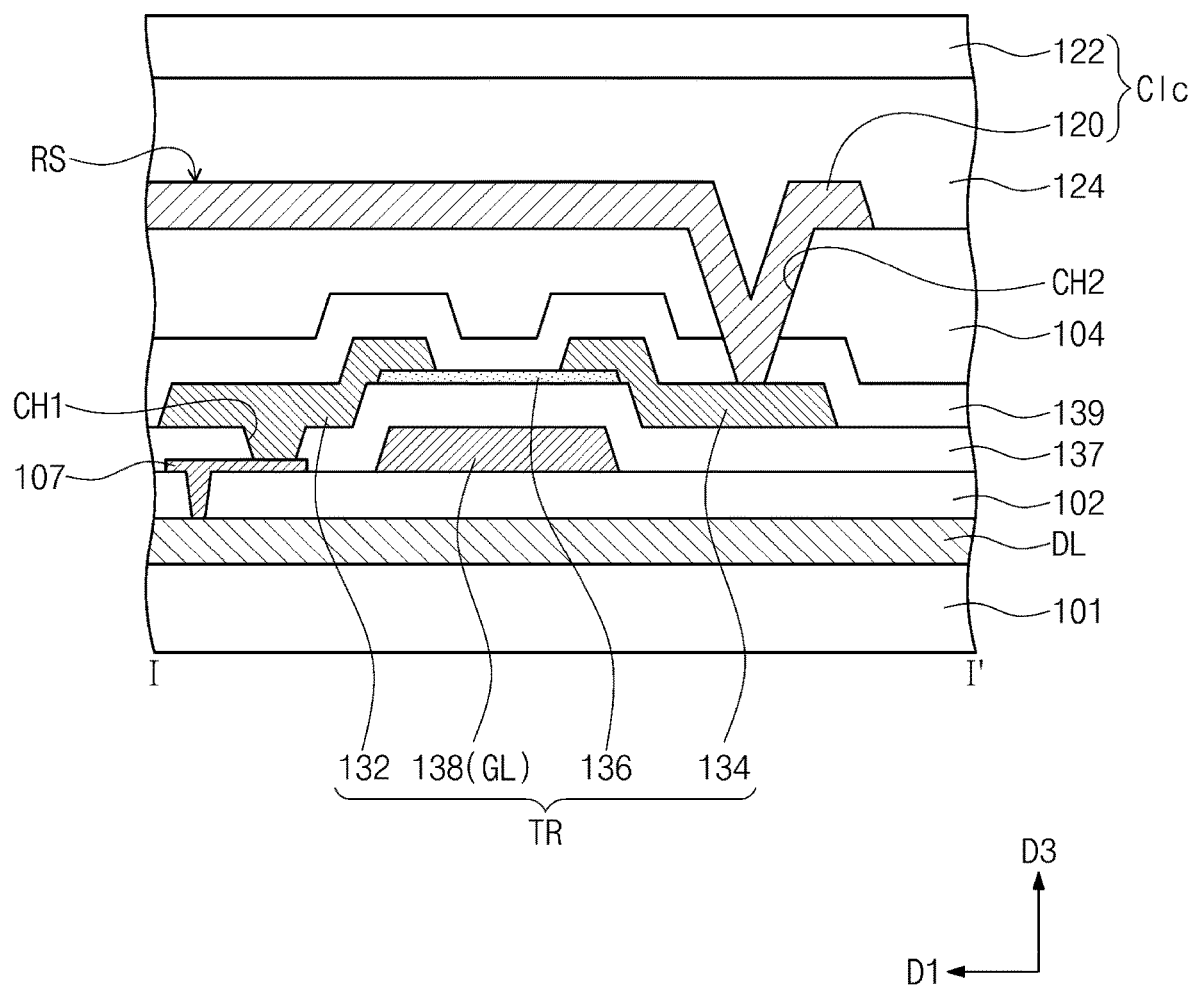

FIGS. 6 and 7 are cross-sectional views of a display device according to embodiments of the inventive concept and correspond to a portion I-I' of FIG. 3. For simplicity of explanation, the description of the same technical features as those of the display device described above may be omitted.

Referring to FIG. 6, the display device may further include a shielding pattern 106 disposed between the gate electrode 138 and the data line DL. The shielding pattern 106 may include a metal. Specifically, a first buffer layer 102a and a second buffer layer 102b may be disposed between the data line DL and the gate line GL. The shielding pattern 106 may be disposed between the first buffer layer 102a and the second buffer layer 102b. The shielding pattern 106 may have the shape of a flat plate. For example, each of the width of the first direction D1 and the width of the second direction D2 of the shielding pattern 106 may be greater than the width of the first direction D1 and the width of the second direction D2 of the gate electrode 138. From a plan viewpoint, the data line DL located below the gate electrode 138 may be covered by the shielding pattern 106. The shielding pattern 106 may prevent signals between the gate line GL and the data line DL from interfering with each other.

Referring to FIG. 7, the display device may further include a contact plug 107 between the data line DL and the first electrode 132. A portion of the contact plug 107 may have an island shape on the buffer layer 102. Another portion of the contact plug 107 may be connected to the data line DL through the buffer layer 102. The contact plug 107 may electrically connect the data line DL and the first electrode 132. As the contact plug 107 is disposed between the data line DL and the first electrode 132, the process margin may be ensured and the reliability of the electrical connection between the data line DL and the first electrode 132 may be increased.

Figure 8:
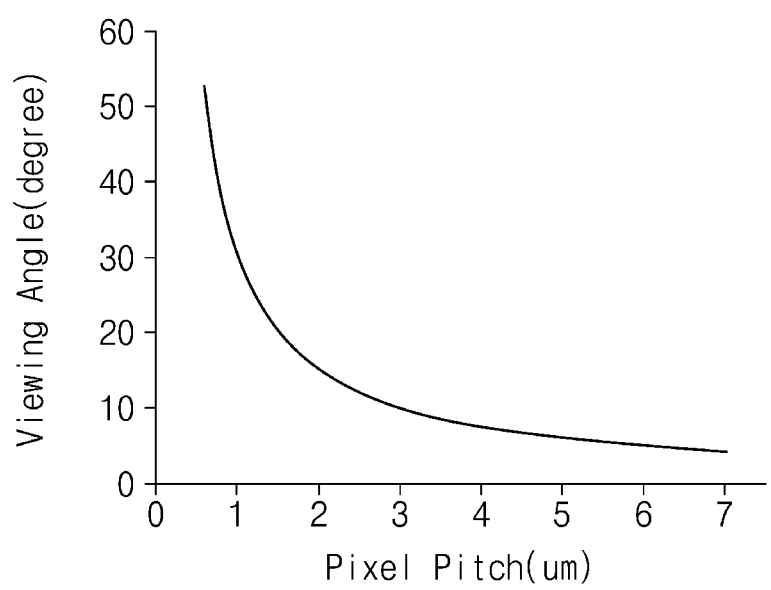
FIG. 8 is a graph showing a correlation between a pixel pitch and a viewing angle.

FIG. 8 is a graph showing a correlation between a pixel pitch and a viewing angle. FIG. 9 is a plan view for explaining a display device according to embodiments of the inventive concept. In the present specification, a pixel pitch may be defined as a distance between two adjacent pixels. For simplicity of explanation, the description of the same technical features as those of the display device described above may be omitted.

Referring to FIG. 8, the viewing angle of the display device may follow the shape of a sine function with respect to a pixel pitch. For example, the viewing angle of the display device may increase or decrease rapidly when the pixel pitch is 3 μm. In order to reduce the pixel pitch, a reduction in the interval dd1 between two adjacent data lines DL may be required.

Referring to FIG. 9, a display device according to embodiments of the inventive concept may include a plurality of pixels PX arranged in two dimensions. According to embodiments, each of the pixels PX may completely overlap with the data lines DL. Therefore, the interval dd1 between the data lines DL may not be limited by the size of each of the pixels PX.

More specifically, the display device may include a plurality of data lines DL and a plurality of gate lines GL. The data lines DL may extend in the first direction D1 and may be arranged in the second direction D2. The gate lines GL may extend in the second direction D2 and may be arranged in the first direction D1. The pixels PX may be formed on the intersection points of the data lines DL and the gate lines GL, respectively.

The interval dd1 between two adjacent data lines DL may not be greater than the width w1 of the second direction of the data line DL. For example, the interval dd1 between two adjacent data lines DL may be equal to the width of the second direction D2 of the data line DL. As another example, the interval dd1 between two adjacent data lines DL may be less than the width w1 of the second direction D2 of the data line DL. The interval d dl between adjacent data lines DL may be, for example, 0.01 μm to 3 μm. The interval dd2 between two adjacent gate lines GL may be greater than the interval dd1 between two adjacent data lines DL.

Figure 10:
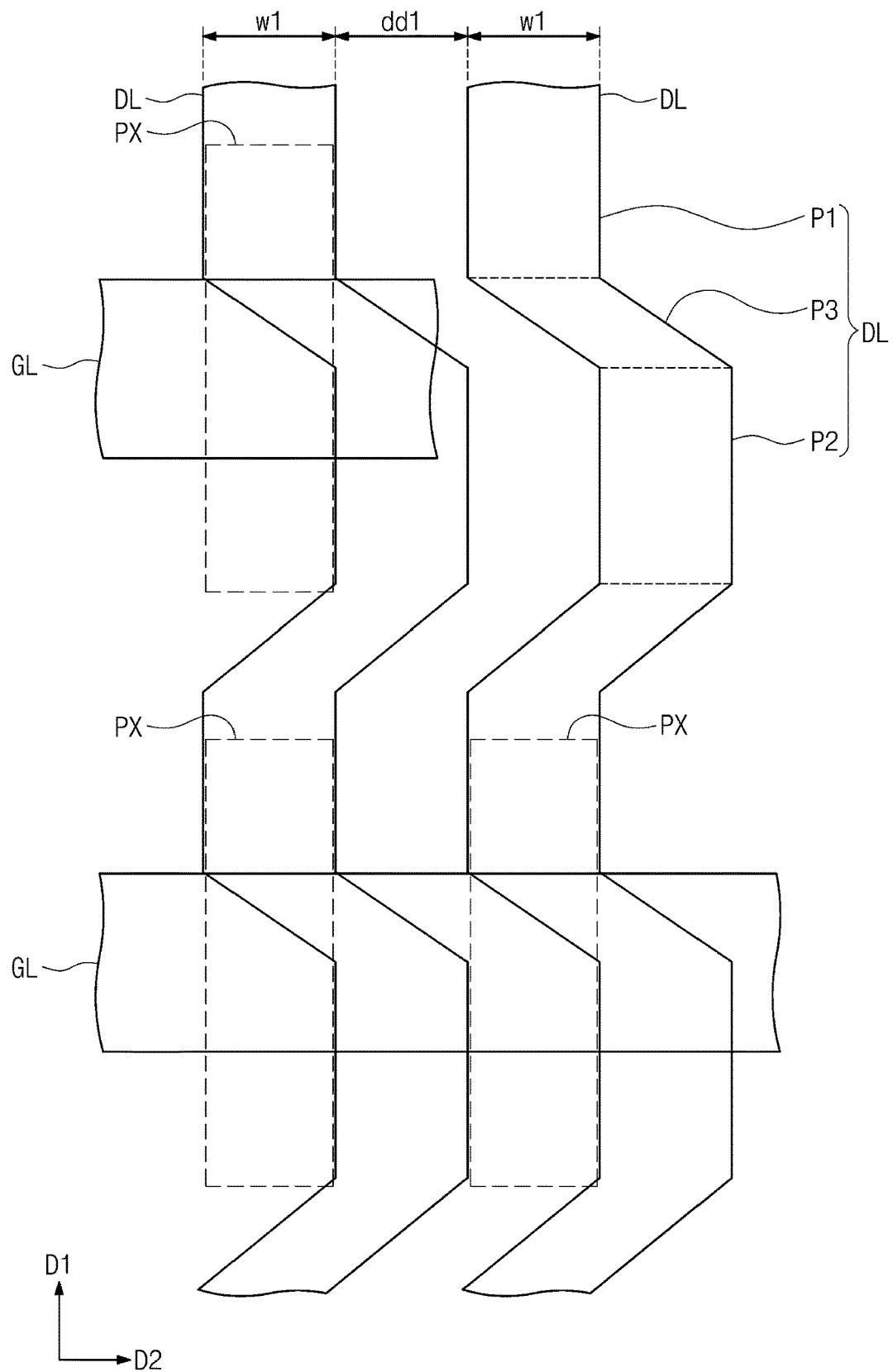
FIGS. 10 and 11 are plan views for explaining a display device according to embodiments of the inventive concept.
Figure 11:
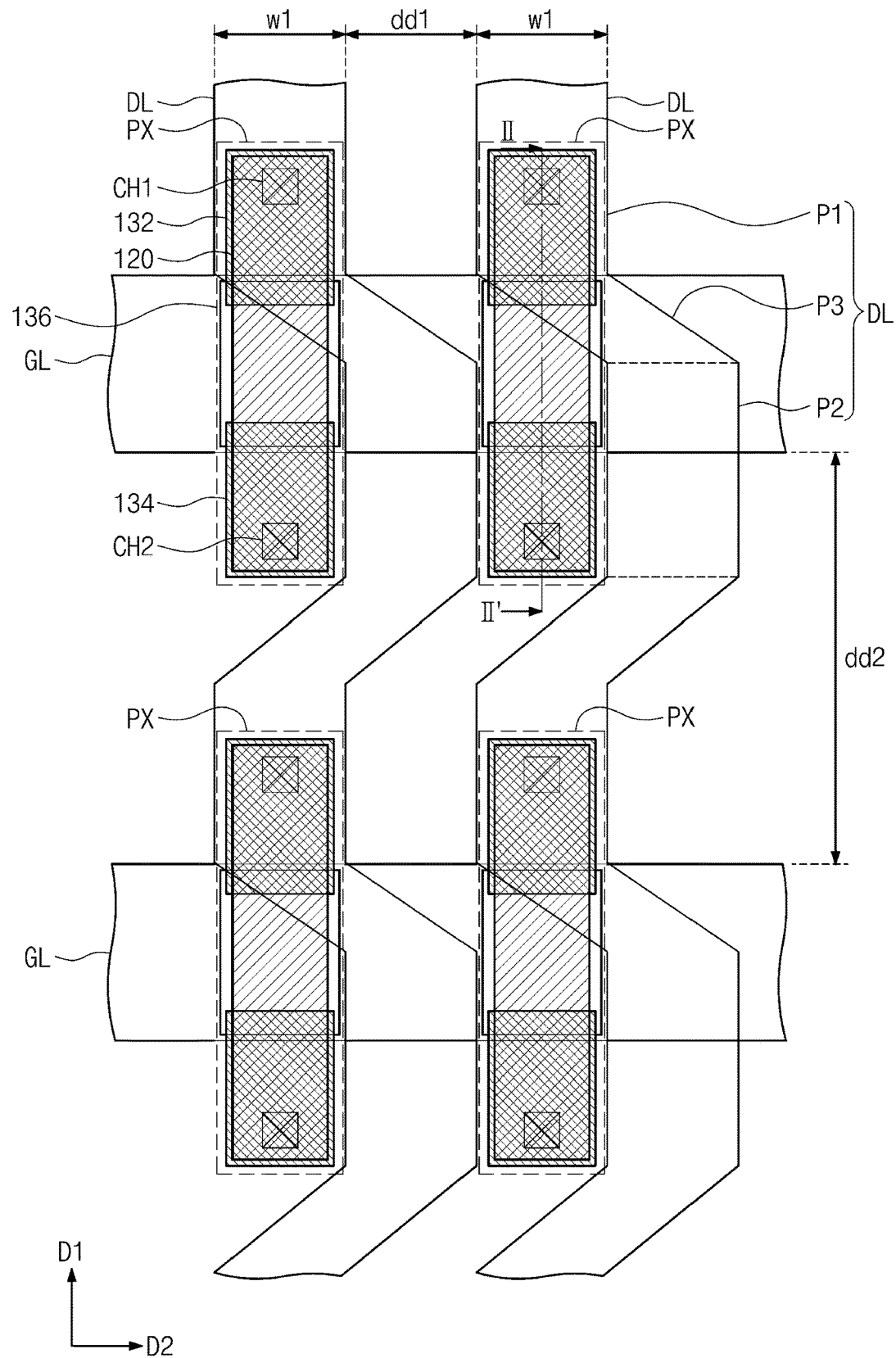
Figure 12:
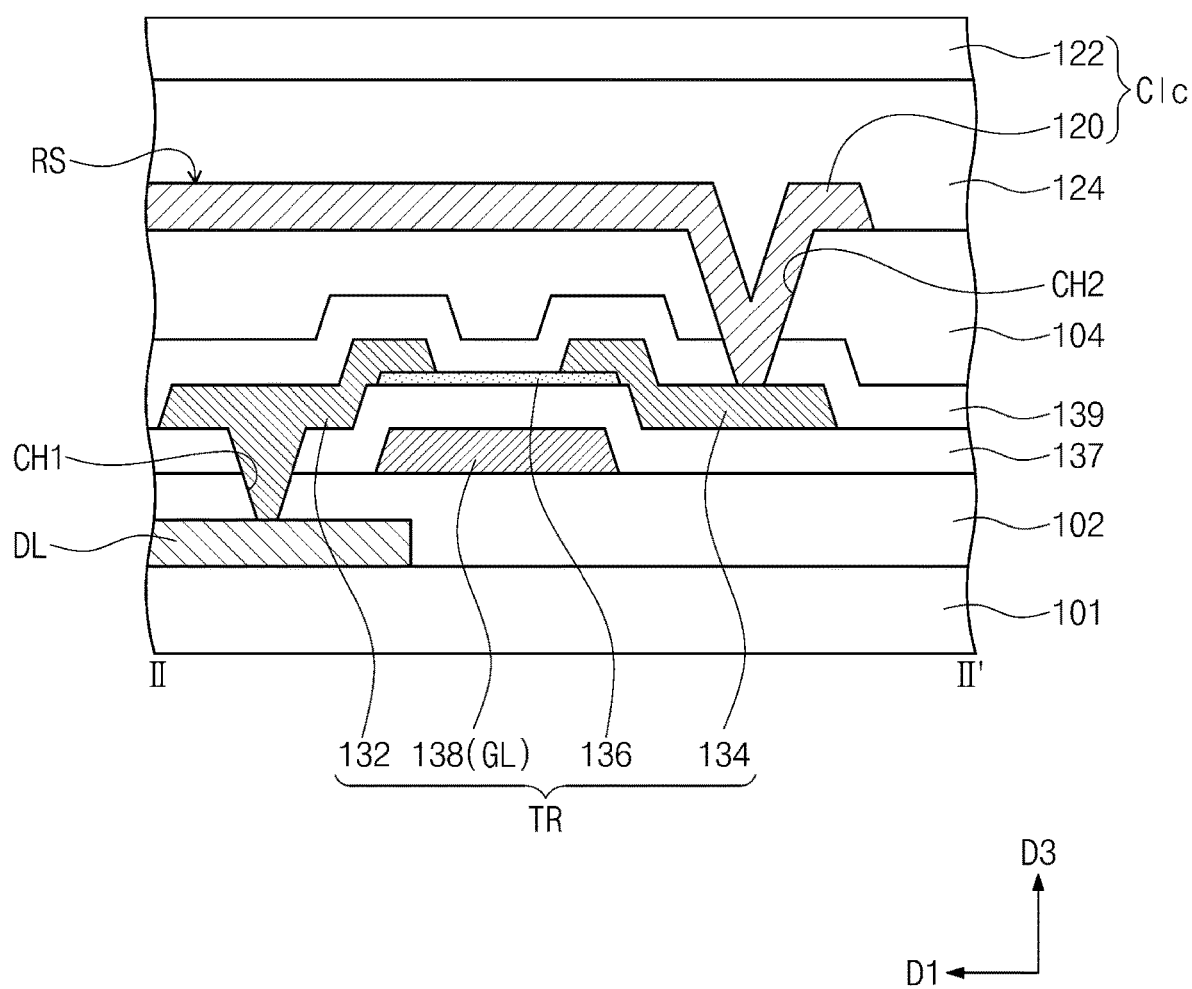
FIG. 12 is a cross-sectional view taken along a line II-II' of FIG. 11.
Figure 13:
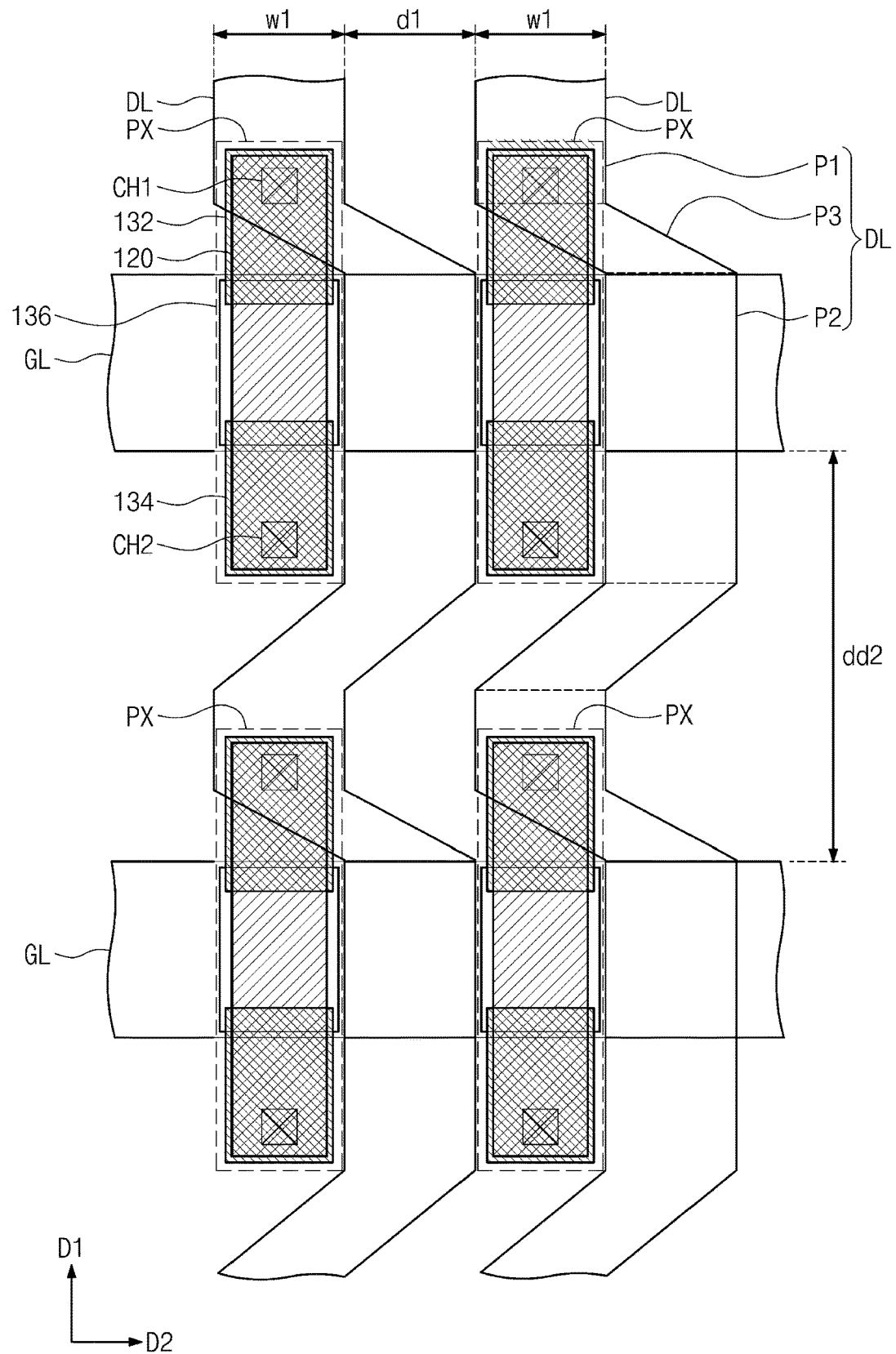
FIG. 13 is a plan view illustrating a display device according to embodiments of the inventive concept.

FIGS. 10 and 11 are plan views of a display device according to embodiments of the inventive concept. FIG. 12 is a sectional view taken along a line II-II' of FIG. 11. FIG. 13 is a plan view for explaining a display device according to embodiments of the inventive concept.

For simplicity of explanation, the description of the same technical features as those of the display device described above may be omitted.

Referring to FIG. 10, the data line DL may extend in the first direction D1 and may have a zigzag shape. Specifically, the data line DL may include a first portion p1, a second portion p2, and a connection portion p3. The first portion p1 may extend in the first direction D1. The second portion p2 may extend in the first direction D1 and may be spaced apart from the first portion p1 in the first direction D1 and the second direction D2. The connection portion p3 may connect the first portion p1 and the second portion p2. According to embodiments, the width of the second direction D2 of the data line DL may be equal to the interval dd1 between two adjacent data lines DL.

Referring to FIGS. 11 and 12, the pixel PX may partially overlap the data line DL. The overlapping area of the data line DL and the gate electrode 138 may be reduced. Accordingly, the data line DL and the gate electrode 138 may not interfere with each other, and the reliability of the display device may be improved.

Specifically, the first portion p1 of the data line DL may at least partially overlap with the first electrode 132. The first contact hole CH1 may be located at a portion where the first portion p1 of the data line DL and the first electrode 132 overlap with each other from a plan viewpoint. The first portion p1 of the data line DL and the first electrode 132 may be connected to each other through the first contact hole CH1.

The second portion p2 of the data line DL may be spaced apart from the first portion p1 of the data line DL in the first direction D1 and the second direction D2. The second portion p2 of the data line DL may not overlap the pixel PX in plan view. According to embodiments, the second portion p2 of the data line DL may be spaced from the semiconductor layer 136 and the gate electrode 138 in the second direction D2.

The connection portion p3 of the data line DL may connect the first portion p1 and the second portion p2. The connection portion p3 of the data line DL may be arranged obliquely with respect to the first direction D1. The connection portion p3 of the data line DL may partially overlap with the semiconductor layer 136 and the gate electrode 138 in plan view.

FIG. 13 is a plan view for explaining a display device according to embodiments of the inventive concept.

For simplicity of explanation, the description of the same technical features as those of the display device described above may be omitted.

Referring to FIG. 13, the first portion p1 of the data line DL may be spaced apart from the gate line GL in the first direction D1. Accordingly, the first portion p1 of the data line DL may be spaced apart from the gate electrode 138 and the semiconductor layer 136 in the first direction D1. Therefore, the data line DL may not overlap the semiconductor layer 136 and the gate electrode 138 from a plan viewpoint. Accordingly, the data line DL and the gate electrode 138 may not interfere with each other, and the reliability of the display device may be improved.

A display device according to embodiments of the inventive concept may be formed by overlapping a pixel with a data line. Thus, a display device in which the interval between two adjacent data lines is reduced, and the viewing angle is increased may be provided. In addition, a thin film transistor according to embodiments of the inventive concept may have a semiconductor layer extending in the same direction as the data lines. Therefore, the ON/OFF characteristics of the transistor may not be affected by the decrease of the pixel pitch. Also, in relation to the display device according to embodiments of the inventive concept, the width of the gate line may be larger than the width of the data line. Thus, the length of the channel of the transistor may be increased, and a display device with improved reliability may be provided.

Although the exemplary embodiments of the inventive concept have been described, it is understood that the inventive concept should not be limited to these exemplary embodiments but various changes and modifications can be made by one ordinary skilled in the art within the spirit and scope of the inventive concept as hereinafter claimed.

What is claimed is:

1. A display device comprising:
   data lines extending in a first direction and arranged in a second direction intersecting the first direction, the data lines including a first data line having a zigzag shape;
   gate lines extending in the second direction and intersecting the data lines, the gate lines being insulated from the data lines;
   a reflective electrode extending in the first direction to intersect one of the gate lines,
   a first electrode extending in the first direction between an upper surface of the first data line and a lower surface of the reflective electrode, the first electrode being electrically connected to the first data line;
   a second electrode extending in the first direction and being spaced apart from the first electrode in the first direction on the lower surface of the reflective electrode, the second electrode being electrically connected to the reflective electrode; and
   a semiconductor layer connecting the first electrode and the second electrode,
   wherein a width in the first direction of the reflective electrodes is greater than a width in the second direction of the reflective electrodes, and a width of the first electrode, in a plan view, is within a width of the first data line in the second direction, and
   the first electrode at least partially overlaps the first data line, and the second electrode is spaced apart from the first data line in the first direction.

2. The display device of claim 1, wherein an interval between the data lines is less than an interval between the gate lines.

3. The display device of claim 1, wherein a width in the first direction of each of the gate lines is greater than a width in the second direction of each of the data lines.

4. The display device of claim 1, wherein in a plan view the width of the reflective electrodes in the second direction is less than a width in the second direction of each of the data lines.

5. The display device of claim 4, wherein in the plan view the reflective electrodes extends across edges of the gate lines at the intersection points.

* * * * *